(12) United States Patent
Gruhlke et al.

(10) Patent No.: US 7,041,964 B2
(45) Date of Patent: May 9, 2006

(54) METHOD AND APPARATUS FOR IMPROVED COLLECTION EFFICIENCY OF SPECKLE BASED NAVIGATION SENSORS USING LIGHTPIPES AND REFLECTORS

(75) Inventors: Russell W. Gruhlke, Fort Collins, CO (US); Dennis C. Diaz, Windsor, CO (US)

(73) Assignee: Avago Technology, Ltd., Singapore (SG)

( * ) Notice: Subject to any disclaimer, the term of this patent is extended or adjusted under 35 U.S.C. 154(b) by 252 days.

(21) Appl. No.: 10/632,619

(22) Filed: Jul. 31, 2003

(65) Prior Publication Data

US 2005/0023449 A1 Feb. 3, 2005

(51) Int. Cl.
*H01J 40/14* (2006.01)

(52) U.S. Cl. .................................. 250/239; 250/216
(58) Field of Classification Search ............... 250/216, 250/239, 214.1, 227.11, 227.13, 227.18, 227.31; 385/146

See application file for complete search history.

(56) References Cited

U.S. PATENT DOCUMENTS 6,628,884 B1 * 9/2003 Duong ..................... 385/146

* cited by examiner

*Primary Examiner*—Que T. Le
*Assistant Examiner*—Tony Lu (57) ABSTRACT

Speckle based optical navigation is improved by increasing the collection efficiency of the photodetector through the introduction of a lightpipe or reflector technology. For example, the use of elliptical sidewalls and diffraction gratings in conjunction with a lightpipe leads to improvements in collection efficiency.

20 Claims, 8 Drawing Sheets

METHOD AND APPARATUS FOR IMPROVED COLLECTION EFFICIENCY OF SPECKLE BASED NAVIGATION SENSORS USING LIGHTPIPES AND REFLECTORS

CROSS REFERENCE TO RELATED APPLICATIONS

This application is related to the patent application Ser. No. 10/632,574, entitled "SPECKLE BASED SENSOR FOR THREE DIMENSIONAL NAVIGATION" filed on the same day and assigned to the same assignee.

FIELD OF INVENTION

The invention relates to increasing the light collection efficiency of photodetector arrays using lightpipe or reflector technology.

BACKGROUND

Speckle patterns are interference patterns emitted from target surfaces illuminated by coherent light. If the target surface moves, the associated speckle pattern is moved as well. This physical phenomenon provides the basis for speckle based navigation sensors. Typically, speckle based navigation sensors include a laser light source, optical components and a photodetector. The speckle pattern consists of speckle "beams" that are emitted nearly isotropically from the illuminated target surface The speckle pattern emitted from an illuminated target surface is made up of quasi-collimated beams of light. The cross sectional diameter of an individual speckle beam is inversely proportional to the diameter of the illuminated spot on the target surface and is proportional to the distance from the target surface. Typically, two photodetector arrays are used in speckle based navigation sensors with each photodetector array sensing motion along one of the axes, respectively. The cross sectional speckle beam size must be matched to the size of the individual photodetector array elements. Hence, the photodetector arrays or collection optics are often positioned at relatively large distances from the target surface and therefore subtend small angles from the target surface. Because speckle "beams" propagate away from the target surface in nearly an isotropic pattern, only a relatively small fraction reaches the photodetector array. This limits the performance of speckle based navigation sensors.

Figure 1:
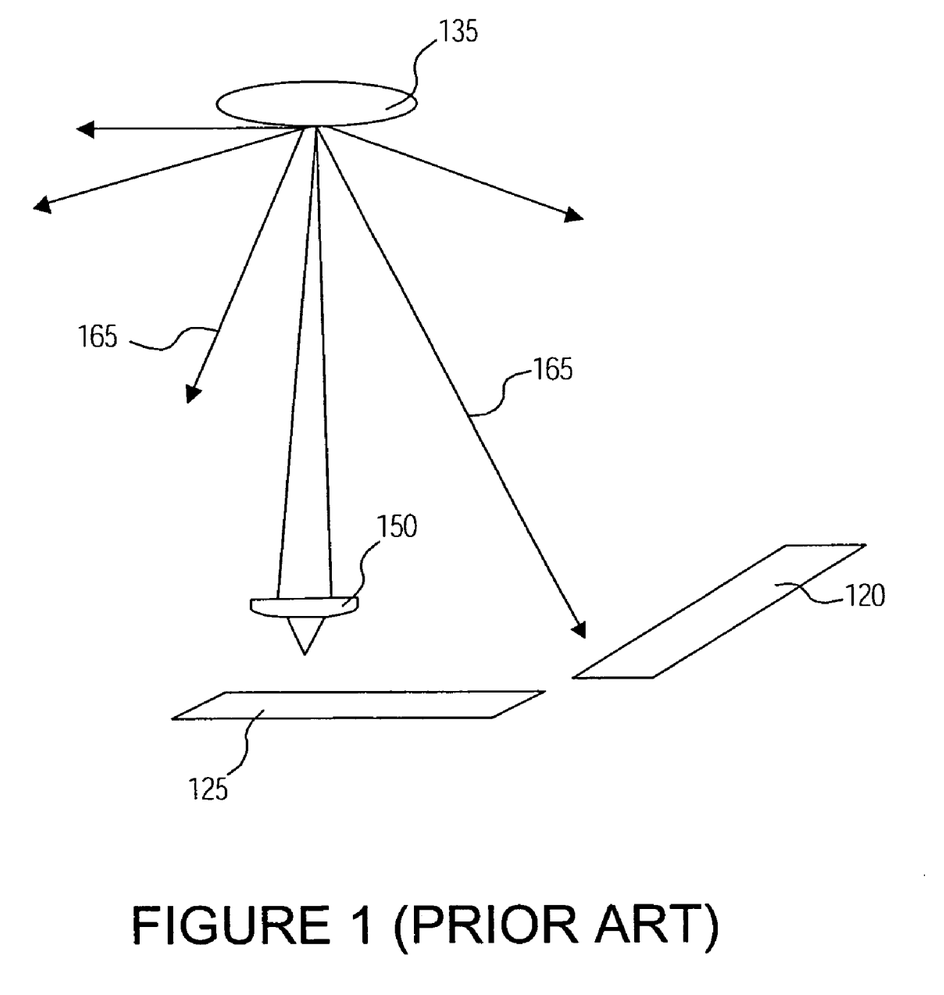
FIG. 1 shows prior art speckle based navigation sensor.

FIG. 1 shows a conceptual view of a conventional speckle based navigation sensor system for two dimensional navigation. Photodetector arrays 120 and 125 detect a fraction of speckle beams 165 from target surface 135. For example, if photodetector arrays 120 and 125 are located approximately 20 mm from target surface 135 illuminated by the laser light, the angles subtended by photodetector arrays 120 and 125 from target surface 135 are about 7×24 degrees. Because speckle is emitted nearly isotropically only about 1% of the speckle flux strikes photodetector arrays 120 and 125, assuming a photodector array area of 2.8×8.6 mm.

SUMMARY OF THE INVENTION

In accordance with the invention, lightpipe and reflector technology is used to increase collection efficiency in speckle based navigation sensors. Increasing the collection efficiency improves the optical performance of speckle based navigation sensors and also allows reduction in the photodetector size at the price of decreased collection efficiency. Smaller photodetector size typically reduces the photodetector cost.

DETAILED DESCRIPTION OF THE INVENTION

Figure 2A:
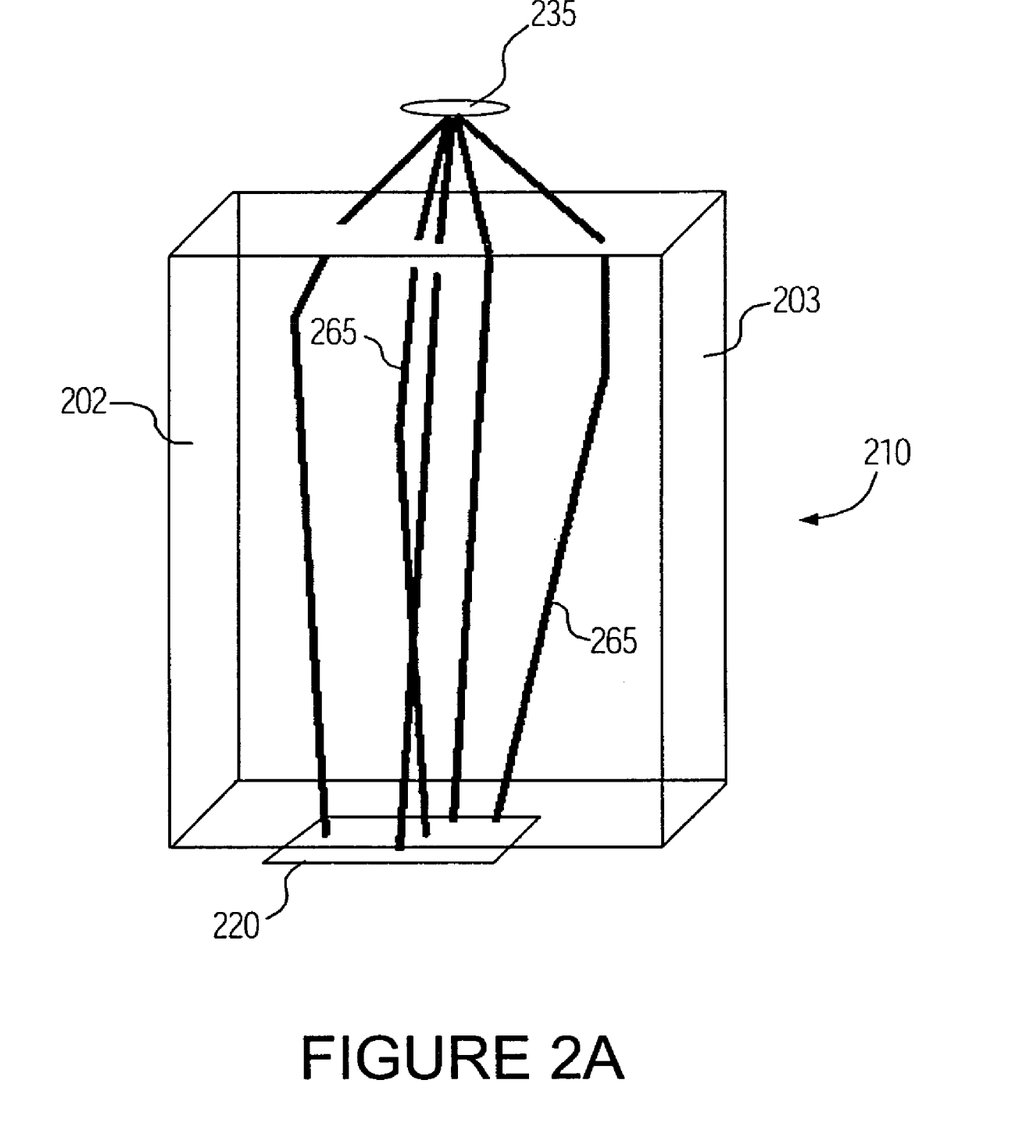
FIG. 2a shows the use of a lightpipe in accordance with the invention to improve collection efficiency of a speckle based optical navigation sensor.

FIG. 2a shows an embodiment in accordance with the invention. Lightpipe 210 is positioned between target surface 235 and photodetector array 220. Lightpipe 210 is made from a transparent material such as, for example, acrylic with a refractive index in the range from about 1.5 to 1.6 or $SiO_2$ to enhance the refractive index contrast with the surrounding medium, typically air. Introduction of lightpipe 210 significantly improves the collection efficiency of speckle beams 265. Photodetector array 220 is positioned directly beneath lightpipe 210. Speckle beams 265 from target surface 235 strike the top of lightpipe 210 and are refracted into the interior. Many speckle beams 265 propagating away from photodetector array 220 are redirected to strike photodetector array 220 by total internal reflection within lightpipe 210. Sides 202 and 203 of lightpipe 210 are typically absorptive to prevent reversal of the apparent motion of the speckle pattern as described below with reference to FIG. 4. Use of lightpipe 210, for example, allows photodetector array 220 with an area of 0.75×2 mm to collect about 11% of speckle beams 265 compared with larger photodetector array 120 that collects only about 1% of speckle beams 165.

Figure 2B:
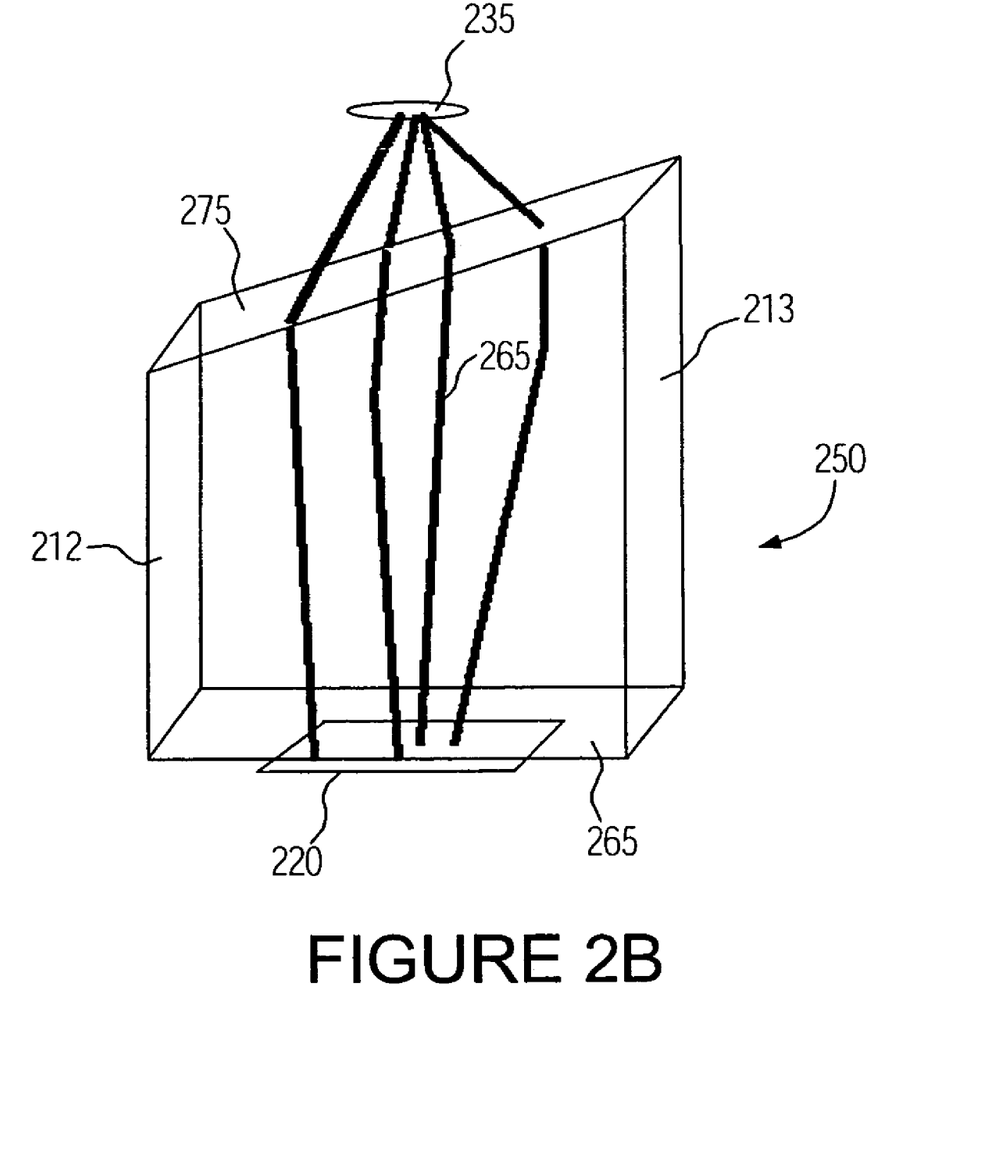
FIG. 2b shows an embodiment of a lightpipe in accordance with the invention where the area of the top face has been increased by slanting it at an angle with respect to the bottom face.

FIG. 2b shows an embodiment in accordance with the invention. Lightpipe 250 is similar to lightpipe 210 but top face 275 is inclined at suitable angle with respect to bottom face 265 in FIG. 2b in order to increase the light gathering area available. Hence, speckle beams 265 that would not be incident on lightpipe 210 are captured by lightpipe 250 because of the larger surface area of top face 275.

Figure 3:
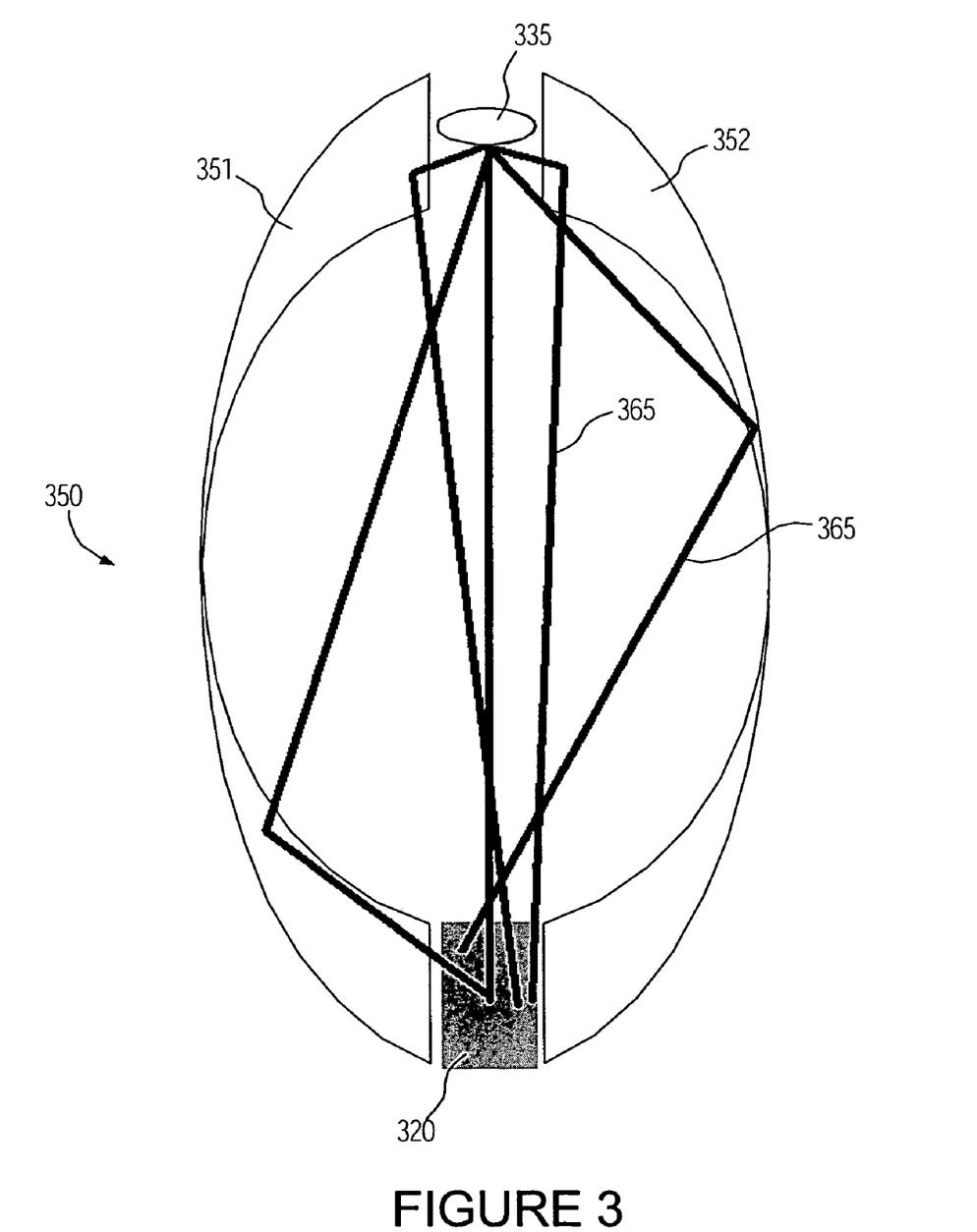
FIG. 3 shows the use of an elliptical reflector in accordance with the invention to improve collection efficiency of a speckle based optical navigation sensor.

FIG. 3 shows an embodiment in accordance with the invention using elliptical reflector 350 to improve the collection efficiency of speckle beams 365. Sidewalls 351 and 352 of elliptical reflector 350 have an elliptical cross-section that is swept in one direction. Optically, an ellipse has the property that that any light ray passing through one focus of the ellipse is reflected towards the second focus of the ellipse. For elliptical sidewalls 351 and 352, the locus of focal points forms two focal lines; one proximate to the bottom of elliptical sidewalls 351 and 352 and one proximate to top of elliptical sidewalls 351 and 352 in FIG. 3. The locus of focal points is also known as the blur spot. By centering target surface 335 on the top focal line of elliptical sidewalls 351 and 352 and centering photodetector array 320 on the bottom focal line, speckle beams 365 striking elliptical sidewalls 351 or 352 are reflected to strike photodetector array 320. Typical coatings for elliptical sidewalls are aluminum, silver and gold. Such metallic high reflectivity coatings typically contain a dielectric overcoat to prevent oxidation. High reflectivity dielectric coatings may also be used. The collection efficiency using reflector 350 is about 9% which is almost about an order of magnitude better than the conventional embodiment in FIG. 1.

Figure 4:
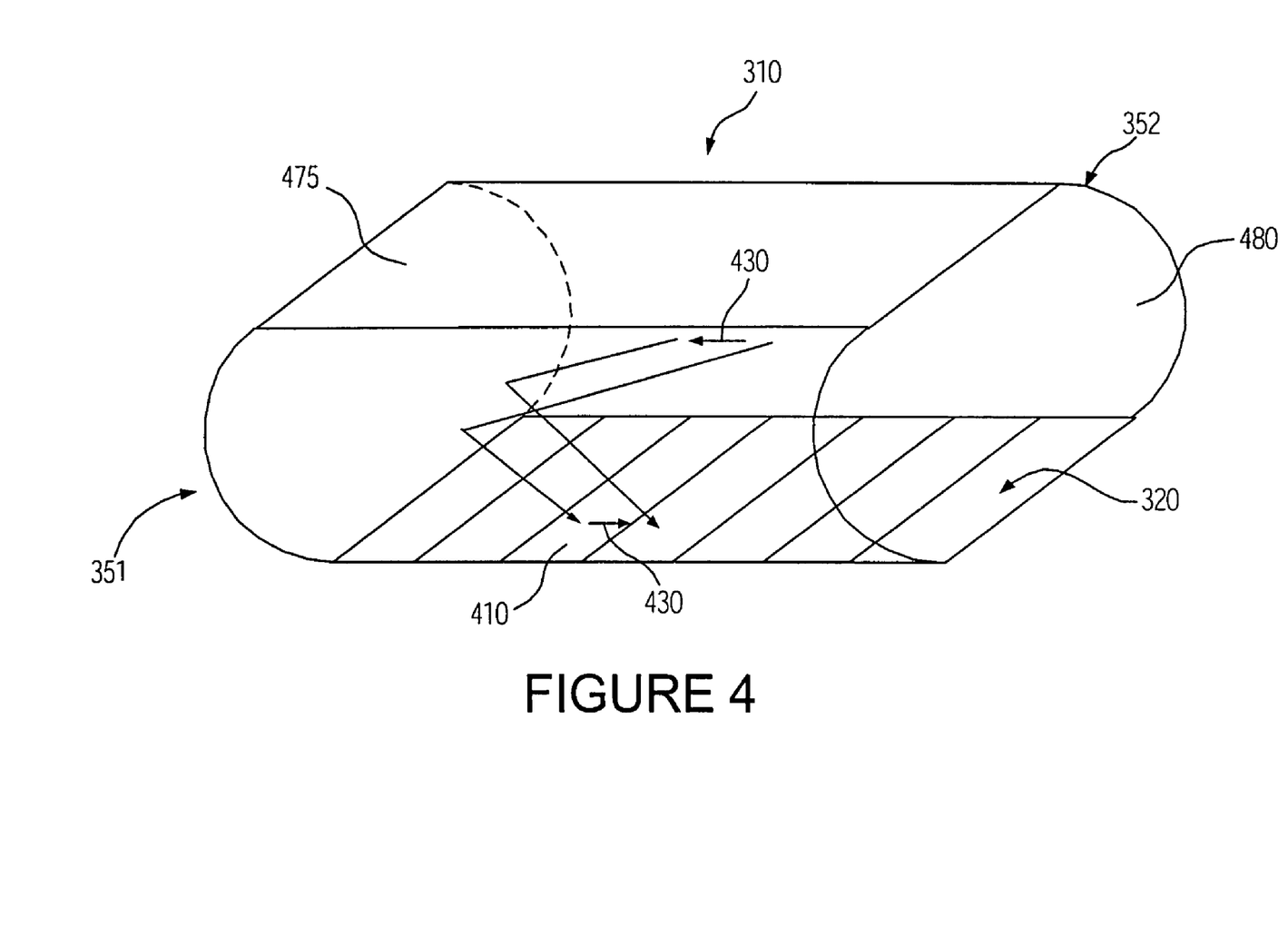
FIG. 4 shows the effect of undesirable boundary reflections in accordance with the invention.

The two remaining sidewalls (sidewalls 475 and 480 in FIG. 4) of reflector 310 are planar and typically are absorptive. Typically, sidewalls 475 and 480 may be made absorptive by application of a black wax or black tape. Black wax is typically a wax with carbon particulates in it. Alternatively, the two remaining sides of reflector 310 may be open. The reason for this is illustrated in FIG. 4 showing a view of reflector 310. When speckle beams 365 (see FIG. 3) are reflected in a direction predominantly perpendicular to detector elements 410 of photodetector array 320, the apparent motion of the speckle pattern is reversed. The apparent motion of speckle pattern 430 is initially in the direction of sidewall 475 but upon reflection from sidewall 475, the apparent motion of speckle pattern 430 is reversed and towards sidewall 480. Hence, only speckle beams 365 reflected in directions predominantly parallel to detector elements 410 of photodetector array 320 provide desirable signals for tracking the apparent motion of speckle patterns. Providing planar sidewalls located some distance from photodetector array 320 also reduces the amount of speckle beams 365 (see FIG. 3) reflected back to photodetector array 320 from the planar sidewalls.

Figure 5:
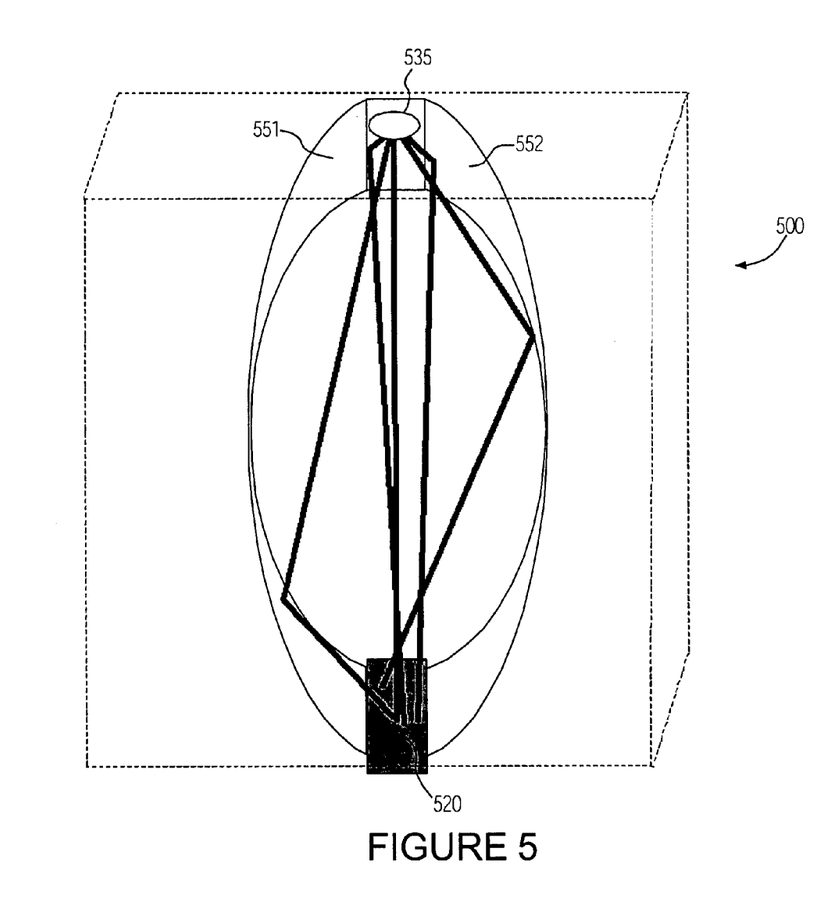
FIG. 5 shows the use of a lightpipe in accordance with the invention having elliptical sidewalls to improve collection efficiency of a speckle based optical navigation sensor.

FIG. 5 shows lightpipe 500 having elliptical sidewalls 551 and 552. FIG. 5 is similar to FIG. 2a but has elliptically shaped sidewalls similar to FIG. 3. Hence lightpipe 500 is made from a transparent material such as, for example, acrylic with a refractive index in the range from about 1.5 to 1.6 or $SiO_2$. Sidewalls 551 and 552 are elliptical and form the interface from the transparent material to air or another material having a different refractive index so that there is a refractive index change along elliptical sidewalls 551 and 552. The planar sidewalls of lightpipe 500 are typically optically absorptive to prevent reversal of the apparent motion of the speckle pattern as described above with reference to FIG. 4. Target surface 535 is typically positioned a small distance away from lightpipe 500 so that most of the speckle beams strike at or near the top focal line of elliptical side walls 551 and 552 in FIG. 5. These speckle beams are then refracted into lightpipe 500. Speckle beams not refracted towards photodetector array 520 undergo total internal reflection from elliptical sidewalls 551 and 552 and are reflected toward the bottom focal line or blur spot. This increases the collection efficiency on photodetector array 520 to about 11.5%.

Figure 6:
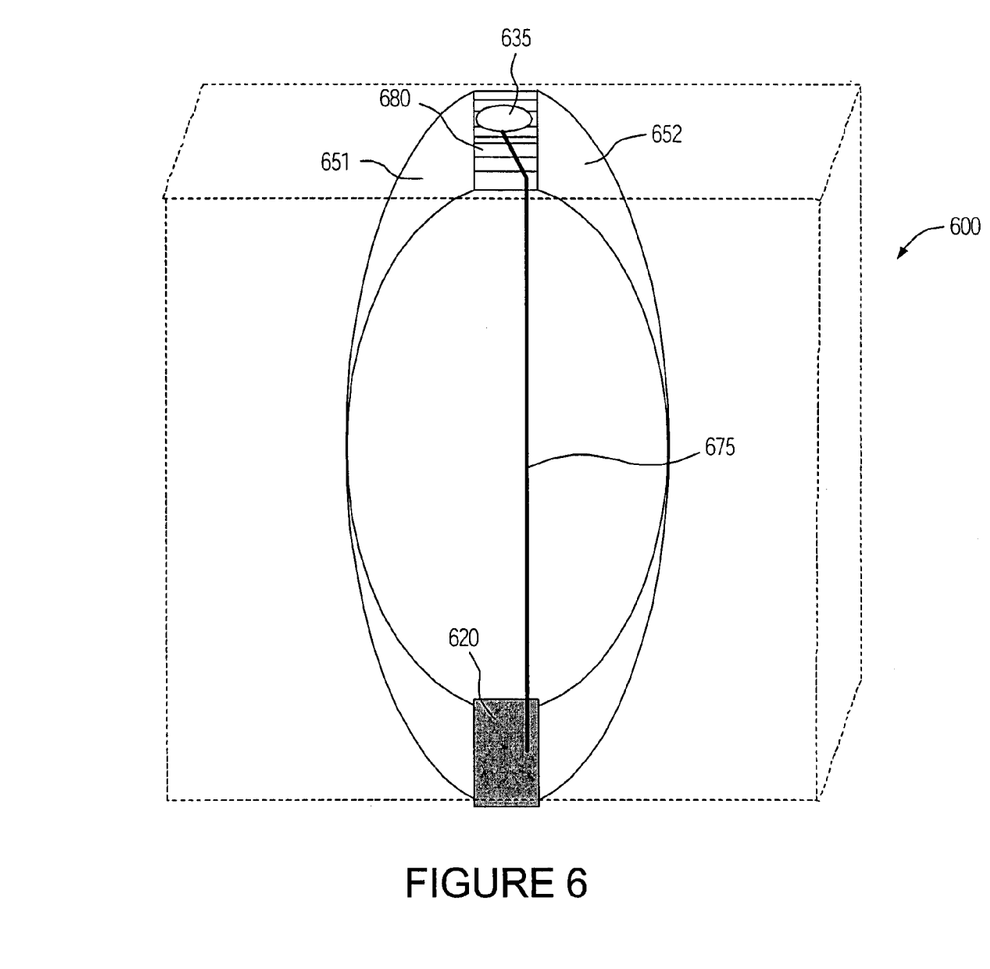
FIG. 6 shows the use of a lightpipe in accordance with the invention having elliptical sidewalls and microstructure to improve collection efficiency of a speckle based optical navigation sensor.

FIG. 6 shows lightpipe 600 having elliptical sidewalls 651 and 652 similar to lightpipe 500 in FIG. 5 but also having microstructure fabricated into lightpipe 600 to further enhance collection efficiency. Typically, the microstructure is a diffraction grating such as diffraction grating 680. The periodicity of diffraction grating 680 is designed such that the periodicity decreases with increasing distance from the center axis of lightpipe 600 according to the formula $$\sin \theta_{incident} - n_{lightpipe} \sin \theta_{diffraction} = \pm m\lambda/\Lambda$$

where $\Lambda$ is the grating periodicity, m is an integer typically set to 1, $\theta_{incident}$ is the angle of incidence onto diffraction grating 680, $\theta_{diffraction}$ is the diffraction angle and $n_{lightpipe}$ is the index of refraction of lightpipe 600. Speckle 675 incident on diffraction grating 680 from target surface 635 is then diffracted towards photodetector array 620 instead of being lost out of the two non-elliptical sidewalls of lightpipe 600. The collection efficiency on photodetector array 620 is improved to about 28%. Similarly, the embodiment in accordance with the invention in FIG. 3 may include a diffraction grating at the top focal line of elliptical sidewalls 351 and 352 opposite photodetector array 320.

Figure 7:
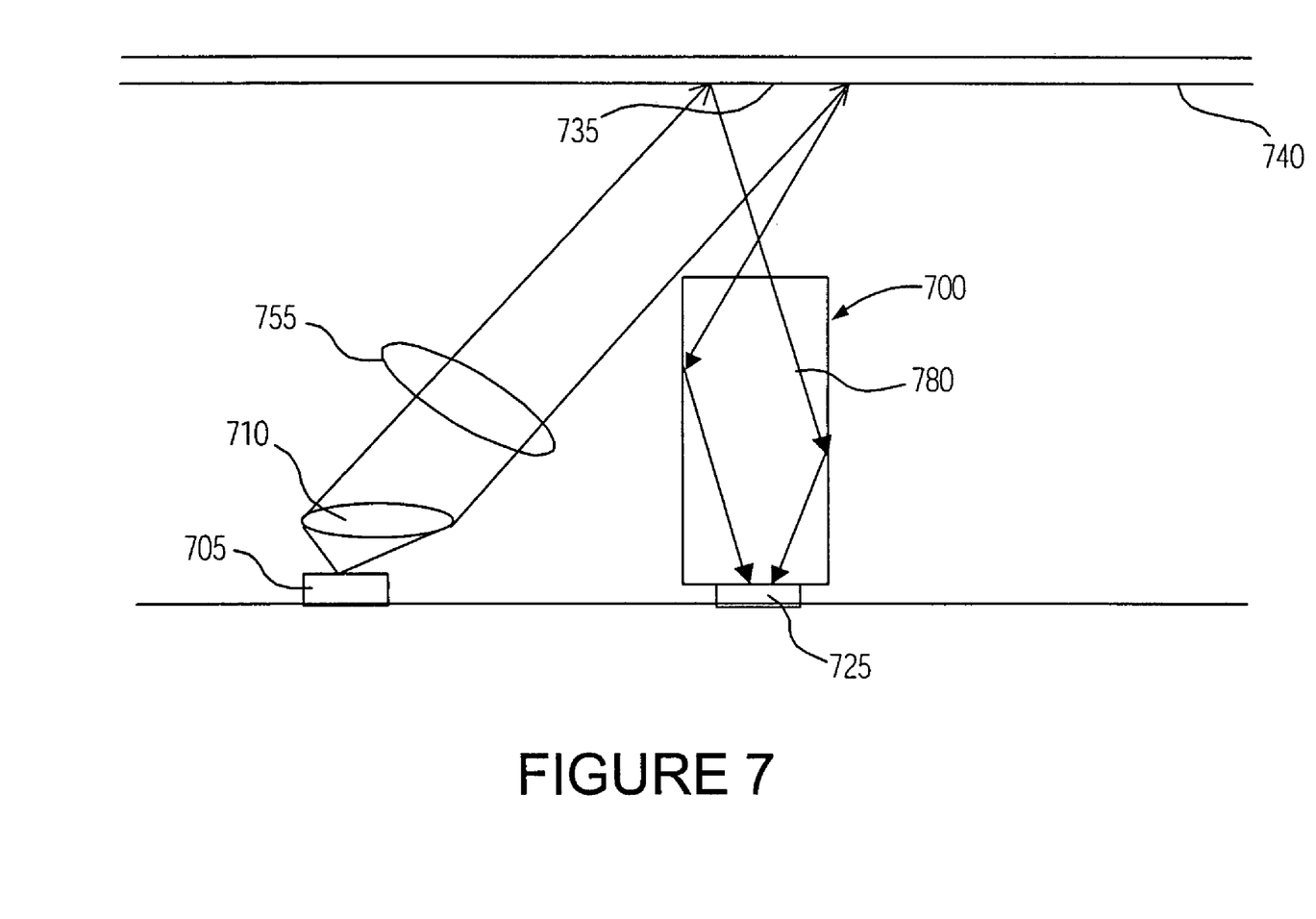
FIG. 7 shows a simplified view of a speckle based optical navigation system having improved collection efficiency in accordance with the invention.

FIG. 7 shows a simplified view of using a lightpipe in the context of speckle based optical navigation sensor in accordance with the invention. Coherent light source 705 is positioned off center with respect to lens 710 so that target surface area 735 may be illuminated. Note that lens 710 may be replaced by, for example, a grating without changing the basic operation. Hence light beam 755 is directed at an angle towards surface 740 to illuminate target surface area 735. Speckle pattern 780 is scattered into light collector 700 for collection at photodetector array 725. Embodiments of light collector 700 includes any of the embodiments in accordance with the invention discussed herein such as lightpipe and reflector light collectors.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

The invention claimed is:

1. A speckle based optical navigation sensor comprising:
   a photodetector array lying in a plane; and
   a lightpipe having a first and second pair of sides and a first and second face, said first pair of sides oriented perpendicular to said plane, said lightpipe enabled so that speckle entering said first face of said lightpipe is directed to said second face of said lightpipe, said second face of said lightpipe being substantially parallel and proximate to said plane.

2. The apparatus of claim 1 wherein said first face is inclined at an angle with respect to said second face thereby increasing the light collection area of said first face.

3. The apparatus of claim 1 wherein said second pair of sides have an elliptical shape.

4. The apparatus of claim 1 wherein said first pair of sides are optically absorptive.

5. The apparatus of claim 1 wherein said first face comprises a microstructure.

6. The apparatus of claim 5 wherein said microstructure is a diffraction grating.

7. The apparatus of claim 1 wherein said lightpipe is comprised of $SiO_2$.

8. The apparatus of claim 1 wherein said lightpipe is comprised of a material having an index of refraction greater than air.

9. A speckle based optical navigation sensor comprising:
   a photodetector array lying in a plane; and an elliptical reflector comprising a pair of elliptical sidewalls, said pair of elliptical sidewalls oriented perpendicular to said plane and positioned so that said photodetector array is centered on a first focal line of said elliptical sidewalls.

10. The apparatus of claim 9 further comprising a pair of planar sidewalls disposed perpendicular to said elliptical sidewalls and said plane.

11. The apparatus of claim 10 wherein said planar sidewalls are coated with a black wax.

12. The apparatus of claim 9 further comprising a diffraction grating centered on a second focal line of said elliptical sidewalls.

13. The apparatus of claim 9 wherein said elliptical sidewalls are coated with aluminum, silver or gold.

14. The apparatus of claim 9 wherein said elliptical sidewalls are coated with a high reflectivity dielectric coating.

15. A method for improved speckle based optical navigation comprising:

providing a photodetector array lying in a plane; and providing a lightpipe having a first and second pair of sides and a first and second face, said first pair of sides oriented perpendicular to said plane, said lightpipe enabled so that speckle entering said first face of said lightpipe is directed to said second face of said lightpipe, said second face of said lightpipe being substantially parallel and proximate to said plane.

16. The method of claim 15 wherein said first face is inclined at an angle with respect to said second face thereby increasing the light collection area of said first face.

17. The method of claim 15 wherein said second pair of sides have an elliptical shape.

18. The method of claim 15 wherein said first face comprises a microstructure.

19. The method of claim 18 wherein said microstructure is a diffraction grating.

20. The method of claim 15 wherein said first pair of sides are optically absorptive.

* * * * *

UNITED STATES PATENT AND TRADEMARK OFFICE
CERTIFICATE OF CORRECTION

PATENT NO. : 7,041,964 B2
APPLICATION NO. : 10/632619
DATED : May 9, 2006
INVENTOR(S) : Russell W. Gruhike et al.

Page 1 of 1

It is certified that error appears in the above-identified patent and that said Letters Patent is hereby corrected as shown below:

Title Page, item (73); Column 1, Line 1, Assignee, delete "Technology," and insert -- Technologies, --;

Column 4, Line 44, Claim 1, delete "so" and insert -- such --;

Column 5, Line 3, Claim 9, delete "so" and insert -- such --;

Column 6, Line 4, Claim 15, delete "so" and insert -- such --.

Signed and Sealed this
Twenty-sixth Day of February, 2013

Teresa Stanek Rea
*Acting Director of the United States Patent and Trademark Office*